(12) United States Patent
Shiraishi

(10) Patent No.: US 6,731,371 B1
(45) Date of Patent: May 4, 2004

(54) EXPOSURE METHOD AND APPARATUS, AND METHOD OF FABRICATING A DEVICE

(76) Inventor: Naomasa Shiraishi, c/o Nikon Corporation (Intellectual Property Department) 2-3 Marunouchi 3-chome, Chiyoda-ku, Tokyo 100-8331 (JP)

( * ) Notice: Subject to any disclaimer, the term of this patent is extended or adjusted under 35 U.S.C. 154(b) by 0 days.

(21) Appl. No.: 09/690,591

(22) Filed: Oct. 18, 2000

(30) Foreign Application Priority Data

Oct. 21, 1999 (JP) .......................................... 11-299331

(51) Int. Cl.[7] .................. G03B 27/52; G03B 27/42; G03B 27/32; A61N 5/00; G03C 5/00
(52) U.S. Cl. ........................... 355/30; 355/53; 355/55; 355/67; 355/77; 250/492.2; 430/30; 430/311
(58) Field of Search ............................. 355/30, 53, 55, 355/67, 77; 250/492.2; 430/30, 311

(56) References Cited

U.S. PATENT DOCUMENTS

| | | | |
|---|---|---|---|
| 4,704,348 A | * 11/1987 | Koizumi et al. | |
| 4,801,352 A | 1/1989 | Piwczyk ..................... | 156/643 |
| 5,025,284 A | * 6/1991 | Komoriya et al. | |
| 5,087,927 A | * 2/1992 | Thomas et al. | |
| 5,103,102 A | * 4/1992 | Economou et al. | |
| 5,559,584 A | 9/1996 | Miyaji et al. .................. | 355/73 |
| 5,877,843 A | * 3/1999 | Takagi et al. | |
| 5,973,764 A | * 10/1999 | McCullough et al. | |
| 5,997,963 A | 12/1999 | Davison et al. ............. | 427/582 |
| 6,208,406 B1 | 3/2001 | Nakashima ................... | 355/30 |
| 6,313,953 B1 | * 11/2001 | Dallas | |
| 6,538,716 B2 | * 3/2003 | Mulkens et al. | |
| 2002/0145711 A1 | 10/2002 | Magome et al. .............. | 355/30 |
| 2003/0006380 A1 | 1/2003 | Van Empel et al. ..... | 250/492.3 |

FOREIGN PATENT DOCUMENTS

| | | |
|---|---|---|
| EP | 1 098 225 A2 | 5/2001 |
| WO | WO 01/06548 A1 | 1/2001 |

* cited by examiner

*Primary Examiner*—Frank G. Font
*Assistant Examiner*—Khaled Brown
(74) *Attorney, Agent, or Firm*—Oliff & Berridge, PLC

(57) ABSTRACT

The image of a pattern of reticle 12 is, being illuminated with exposure light IL of vacuum ultraviolet range, projected, via projection optical system PL, onto wafer 17*a* on wafer stage 18*a* in wafer chamber 24. By providing gas blowing plate 15 in which aperture portion 15*a* for the exposure light optical path is provided between projection optical system PL and wafer 17*a*, exhausting a gas in the first space S1 over gas blowing plate 15 via exhaust port G1e, purifying the exhausted gas, and then by blowing the purified gas again into space S1 via gas supply port G1i, outgases from wafer 17*a* are efficiently exhausted. Into the second space S2 under gas blowing plate 15 is supplied a gas of which contamination degree of impurities is controlled to be more relaxed compared with the gas in the first space S1. By this, even when using vacuum ultraviolet light as exposure light, with the decrease of transmittance on the optical path being controlled, a high exposure light intensity can be obtained.

37 Claims, 7 Drawing Sheets

EXPOSURE METHOD AND APPARATUS, AND METHOD OF FABRICATING A DEVICE

INCORPORATION BY REFERENCE

The disclosure of the following priority application is incorporated herein by reference:

Japanese Patent Application No. 11-299331 filed on Oct. 21, 1999.

BACKGROUND OF THE INVENTION

1. Field of the Invention

The present invention relates to an exposure method and an exposure apparatus used in a photolithography process for manufacturing micro devices such as semiconductor circuits, image pick-up devices (such as CCDs), liquid crystal displays, plasma displays, and thin film magnetic heads.

2. Description of the Related Art

In a photolithography process for forming a fine pattern of an electric device such as a semiconductor circuit or liquid crystal display, a projection exposure apparatus such as a stepper is used when transferring an original pattern of a reticle as a mask onto a wafer (or a glass plate) as a substrate to be exposed. In such a projection exposure apparatus, to improve its resolution to address a still finer integration level of micro devices, its exposure wavelength has shifted to a still shorter wavelength region. As the exposure wavelength, 248 nm of a KrF excimer laser is mainly used at present, but a shorter wavelength of about 200 nm or less in the vacuum ultraviolet region has also come to be used. In other words, the 193 nm wavelength of an ArF excimer laser is now virtually in practical use, and a projection exposure apparatus utilizing a laser such an $F_1$ laser (of 157 nm wavelength) or an $Ar_2$ laser (of 126 nm wavelength), each having a still shorter wavelength, as an exposure light source is now being developed.

Further, since the resolution can be improved by increasing the numerical aperture (NA) of a projection optical system, a still larger NA of a projection optical system is also being developed. In this connection, because a smaller exposure view field (exposure field) of a projection optical system advantageously affects in realizing a larger NA, the view field of a projection optical system itself is made smaller on one hand and, on the other hand, scanning exposure type exposure apparatuses such as a step-and-scan type exposure apparatus, which secures virtually a large view field by relatively scanning a reticle and a wafer during exposure, are also under practical use.

In a scanning exposure type exposure apparatus, in particular, because each of stages, on which a reticle or a wafer is mounted, should be driven with high precision, an air bearing system, which reduces friction during the movement of the stage by floating the stage by airflow, is adopted as a supporting system for the stage.

In recent years, light of vacuum ultraviolet range has been proposed to be used as exposure light; however, optical materials having practically applicable transmittance relative to vacuum ultraviolet light and usable as a lens or a reticle are limited to synthetic quartz, quartz doped with, e.g., fluorine, and crystals such as fluorite ($CaF_2$), magnesium fluoride ($MgF_2$), and lithium fluoride (LiF). Further, vacuum ultraviolet light is strongly absorbed by gases on the optical path such as an oxygen gas, moisture, and a hydrocarbonaceous gas (hereinafter, called "absorbent gas"), and, furthermore, evaporated organic substances and the like, which react with vacuum ultraviolet light and result clouding substances on the surface of an optical element, can also be regarded as absorbent gases. Therefore, to exclude those absorbent gases from the optical path of exposure light, the gases on the optical path are required to be replaced with gases such as a nitrogen gas or a rare gas having small absorbency relative to vacuum ultraviolet light (hereinafter, called "transmitting gas"). For instance, with respect to oxygen concentrations, the average concentration should be controlled to a level of ppm order. When the residual concentrations of the absorbent gases does not satisfy such specifications, exposure energy on a wafer considerably decreases, and, as a result, the throughput deteriorates because a longer exposure time is required.

Meanwhile, since in an exposure apparatus, wafers are sequentially exchanged and transferred with a fine pattern, wafers are required to be frequently moved in and out (exchanged) between an inside space including an exposure path and an outside space where the wafers are conveyed. As a result, during the wafer exchange operation, absorbent gases such as an oxygen gas and moisture flow into the inside space along with the conveyed wafers, and easily evaporable organic substances and the like adsorbed on the wafers are also conveyed. Further, because photoresist coated on the wafers itself releases a hydrocarbonaceous gas and the like (outgases), the concentrations of absorbent gases in the optical path cannot be easily kept within a predetermined level with respect to the atmosphere in the vicinity of the wafers.

Also, with respect to an exposure apparatus utilizing vacuum ultraviolet light as its exposure light, when a conventional air bearing system is adopted as a supporting system of a wafer stage and a reticle stage, a large amount of gas is necessary to float the stages. As a result, the gas for floating may flow into the atmospheres, where the stages are positioned, in the vicinity of a wafer and a reticle. If the gas for floating is an absorbent gas as normal atmospheric air, the transmittance of the atmosphere decreases. It is therefore preferable that also as the gas for floating, highly-purified transmitting gas is used. However, there is a problem that, to continuously control the concentrations of absorbent gases in the gas for floating used in relatively high volume within a predetermined level, the associated running costs increase.

Further, with respect to a wafer stage and a reticle stage of an exposure apparatus, their positions are normally measured with high precision by means of laser interferometers. In a laser interferometer, a moving mirror and a fixed mirror are each illuminated with a laser beam, and the position of the moving mirror (movable stage) is measured with reference to the fixed mirror. Also with this case, to improve the measurement accuracy of the laser interferometer, it is preferable, while supplying a transmitting gas on the optical path of exposure light, that the influence of gas fluctuation, accompanying the transmitting gas supply, on the optical path of the laser beams is made as little as possible.

SUMMARY OF THE INVENTION

In view of the above, it is a first object of the present invention to provide an exposure method and an exposure apparatus by which, even when using vacuum ultraviolet light as exposure light, a high exposure light intensity can be obtained by controlling the decrease of transmittance on an optical path.

Further, it is a second object of the present invention to provide an exposure method and an exposure apparatus by which, when adopting an air bearing system as a supporting system of a stage that moves a reticle or a wafer and even when using vacuum ultraviolet light as exposure light, the decrease of transmittance on an optical path can be controlled without increasing operating costs so much.

Further, it is a third object of the present invention to provide an exposure method and an exposure apparatus by which, when measuring, by a laser interferometer, the position of a stage that moves a reticle or a wafer and even when using vacuum ultraviolet light as exposure light, the decrease of transmittance relative to exposure light can be controlled without decreasing the measurement accuracy of the laser interferometer.

Further, it is a fourth object of the present invention to provide an exposure method and an exposure apparatus by which, even in such a case where vacuum ultraviolet light is used as exposure light, the position of a reticle or a wafer can be accurately detected.

Also, it is another object of the present invention to provide a device manufacturing method capable of mass-producing devices with high throughput using such exposure methods above.

A first exposure method according to the present invention is an exposure method in which a second object is exposed, via a projection system, with an exposure beam that has passed a pattern of a first object, the exposure method comprising: dividing the space between the projection system and the second object into a first space on the side of the projection system and a second space on the side of the second object and providing, in the boundary portion between the first and second spaces, an aperture portion at a region through which at least the exposure beam passes; and supplying a first gas that transmits the exposure beam to the first space side, wherein the first gas' contamination degree of impurities that absorb the exposure beam is smaller than that of a second gas of the second space side.

In connection with the present invention, the kind of affecting impurities varies depending upon the wavelength of the exposure beam. Further, the transmittance of the space in the vicinity of the second object is apt to change due to impurities' intrusion during the exchange of the second object and due to impurities and the like adhered to the second object itself. In contrast, in the present invention, because the space in the vicinity of the second object is divided into a first space and a second space, with the first space being supplied with a gas with high transmittance, the proportion, in the space in the vicinity of the second object, of the space with low transmittance relative to the exposure beam is made small, and thus the decrease of transmittance as a whole can be controlled. As a result, with the intensity of the exposure beam on the second object being maintained to be high, the throughput of the exposure process improves.

In this case, it is preferable that the first gas is blown in a single direction in the first space. As a result, the decrease of transmittance of the first space is controlled, and, at the same time, because with the gas condition of the space over the second object being stabilized, the refractive index distribution in the planes perpendicular to the optical axis is uniformed, and the imaging characteristics are also stabilized. Further, impurities such as an outgas and the like generating from the second object are also efficiently exhausted by the first gas.

Next, a second exposure method according to the present invention is an exposure method in which a second object is exposed, via a projection system, with an exposure beam that has passed a pattern of a first object, the exposure method comprising: disposing a stage holding the first object or the second object and moving on a base member in a space supplied with a third gas that transmits the exposure beam; floating the stage on the base member in a differential exhaust system by blowing a fourth gas and sucking the fourth gas; and setting, at the same time, the permissible absorbency limits of the fourth gas relative to the exposure beam higher than that of the third gas.

According to the present invention above, because the stage is floated in a differential exhaust system, the leakage amount of the fourth gas to the outside is small. Accordingly, even when setting the absorbency limits of the fourth gas relative to the exposure beam high and thus decreasing the operating costs, the decrease of transmittance of the exposure beam on the optical path in the vicinity of the stage can be controlled.

Further, a third exposure method according to the present invention is an exposure method in which a second object is exposed, via a projection system, with an exposure beam that has passed a pattern of a first object, the exposure method comprising: measuring the position of the first object or the second object relative to a predetermined reference member by illuminating a stage moving with the first object or the second object and the reference member with a measurement beam and a reference beam, respectively; and making both of the optical paths of the measurement beam and the reference beam to be gaseous atmospheres each having about the same contamination degree of impurities that absorb the exposure beam.

According to the present invention above, because while supplying a gas that transmits the exposure beam on the optical path of the exposure beam in the vicinity of the stage, both of the refractive index fluctuations of the gases supplied to the optical paths of the measurement beam and the reference beam are made to be about the same amount, the measurement accuracy is maintained high.

Further, a fourth exposure method according to the present invention is an exposure method in which a second object is exposed, via a projection system, with an exposure beam that has passed a pattern of a first object, the exposure method comprising: dividing the space between the projection system and the second object into a first space on the side of the projection system and a second space on the side of the second object and providing, within the boundary portion between the first and second spaces, an aperture portion at a region through which at least the exposure beam passes; blowing a gas that transmits the exposure light to the first space; and exhausting, via the gas blown in the first space, a substance generated from the second object by the illumination thereof with the exposure beam from the optical path of the exposure beam.

According to the present invention above, because impurities such as an outgas and the like generating from the second object during exposure are efficiently exhausted by the first gas, the transmittance of the exposure beam is maintained high. Furthermore, because clouding substances generated by chemical reaction of the outgas substance are prevented from adhering to the forefront lens of the projection system (the lens nearest to the second object), the transmittance of the exposure beam is maintained high at all times.

Further, a fifth exposure method according to the present invention is an exposure method in which a second object is exposed, via a projection system, with an exposure beam that has passed a pattern of a first object, the exposure method comprising: dividing the space between the projection system and the second object into a first space on the side of the projection system and a second space on the side of the second object and providing, within the boundary portion between the first and second spaces, an aperture at a region through which a detection beam for detecting the position of the first object or the second object passes; and supplying a gas through which the exposure beam passes to the first space.

According to the present invention above, the gas that transmits the exposure beam can be effectively supplied to the first space on the side of the projection system, and at the same time, the second object can be illuminated with the detection beam via the aperture.

Further, a sixth exposure method according to the present invention is an exposure method in which a second object is exposed, via a projection system, with an exposure beam that has passed a pattern of a first object, the exposure method comprising: dividing the space between the projection system and the second object into a first space on the side of the projection system and a second space on the side of the second object; and setting the contamination degree of impurities of the first space smaller than that of the second space. According to the present invention, as with the first exposure method, the operating costs can be controlled to be low, and the transmittance of the exposure beam can be maintained high.

Next, a first exposure apparatus according to the present invention is an exposure apparatus in which a second object is exposed, via a projection system, with an exposure beam that has passed a pattern of a first object, the exposure apparatus comprising: an aperture plate which is disposed between the projection system and the second object and on which an aperture for making the exposure beam pass through is formed; a gas supply mechanism that supplies a first gas that transmits the exposure beam to a first space between the aperture plate and the projection system; and an environment control mechanism that controls the environment of a second gas which is supplied to a second space between the aperture plate and the second object and transmits the exposure beam and, at the same time, of which contamination degree of impurities that absorb the exposure beam is different from that of the first gas.

Further, a second exposure apparatus according to the present invention is an exposure apparatus in which a second object is exposed, via a projection system, with an exposure beam that has passed a pattern of a first object, the exposure apparatus comprising: a stage that holds the first object or the second object and moves on a base member; a chamber that substantially hermetically seals a space enclosing the stage; a gas supply device that supplies a third gas that transmits the exposure beam into the chamber; and an air bearing device that float the stage on the base member in a differential exhaust system by blowing a fourth gas and sucking the fourth gas, wherein the permissible absorbency limits of the fourth gas relative to the exposure beam is set higher than that of the third gas.

Further, a third exposure apparatus according to the present invention is an exposure apparatus in which a second object is exposed, via a projection system, with an exposure beam that has passed a pattern of a first object, the exposure apparatus comprising: a stage that moves with the first object or the second object; a reference member that is stationary relative to the projection system; an interferometer that measures the position of the first object or the second object relative to the reference member by illuminating the stage and the reference member with a measurement beam and a reference beam, respectively; and a gas supply device that supplies each of gases each having about the same contamination degree of impurities that absorb the exposure beam to each of the optical paths of the measurement beam and the reference beam.

Further, a fourth exposure apparatus according to the present invention is an exposure apparatus in which a second object is exposed, via a projection system, with an exposure beam that has passed a pattern of a first object, the exposure apparatus comprising: an aperture plate which is disposed between the projection system and the second object and on which an aperture for making a detection beam for detecting the position of the first object or the second object pass through is formed; and a first gas supply mechanism that supplies a first gas that transmits the exposure beam to a first space between the aperture plate and the projection system.

Each of above exposure methods according to the present invention can be performed by the use of each of such exposure apparatuses.

It is to be noted that as the first, second, and third gases in the present invention, a nitrogen gas, a rare gas (helium, neon, argon, krypton, xenon, or radon), a mixed gas of these gases may be utilized. Furthermore, as the first, second, and third gases, the same gas with each other or different gases from one another may be utilized. On the other hand, in contrast with the first, second, and third gases, because the fourth gas is a gas for floating the stage on the base member, a gas, such as dry air, that has low transmittance relative to exposure light but is inexpensive can utilized as the fourth gas.

Further, the aperture plate in the present invention may be so configured that a through hole is formed as the aperture or that the through hole is provided with a glass substrate that transmits the exposure beam. Still further, the aperture plate may be constructed from a combination of a plurality of plates. In this case, the portion between the plurality of plates corresponds to the aperture.

Next, a device manufacturing method according to the present invention includes a process that transfers a device pattern onto a workpiece using an exposure method according to the present invention.

In accordance with to the above-described first, fourth, and sixth exposure methods according to the present invention, by locally supplying a gas that transmits the exposure beam to, for example, the first space on the side of the projection system, an outgas including impurities generating from the second object, for example, can be effectively excluded from the optical path of the exposure light. Thus, with the transmittance relative to the exposure beam being made high, the exposure intensity can be made high, and at the same time, the consumption of the gas can be made small, and thus the operating costs can be decreased. Further, this also effectively influences on the increase in longevity of the projection system.

Further, by making the shape of the aperture of the boundary portion between the first and second spaces, for example, a narrow slit-like form, the compatibility with a focus detection device of oblique incident type is facilitated, and thus the compatibility with precision focusing can also be facilitated.

Further, in accordance with to the second exposure method according to the present invention, by making an air bearing mechanism used, for example, in a scanning exposure type exposure apparatus to be a differential exhaust system, even when the specifications of the impurities gases (gases that absorb the exposure beam) in the gas for floating to be supplied to air pads are relaxed to a large extent, the transmittance of the exposure beam can be maintained high. Furthermore, the operating costs required for gas purification can be decreased.

Further, in accordance with to the third exposure method according to the present invention, by blowing gases that include substantially the same amount of impurities to both of the measurement side optical path and the reference side optical path of the interferometer for position measurement, measurement errors due to impurities on the optical paths of the interferometer can be decreased.

Further, in accordance with to the fifth exposure method according to the present invention, because the exposure intensity can be maintained high, and, at the same time, the second object can be illuminated with the detection beam via the aperture of the aperture plate, the position of the second object can be detected with high precision, and thus the image of the pattern of the first object can be transferred onto the second object with high resolution.

Further, the exposure methods according to the present invention can be performed by each of the exposure apparatuses according to the present invention, and, at the same time, in accordance with the device manufacturing method according to the present invention, because the intensity of the exposure beam can be maintained high, the throughput of manufacturing processes of various kinds of devices can be increased.

BRIEF DESCRIPTION OF THE DRAWINGS

In the accompanying drawings.

DETAILED DESCRIPTION OF THE PREFERRED EMBODIMENTS

Figure 1:
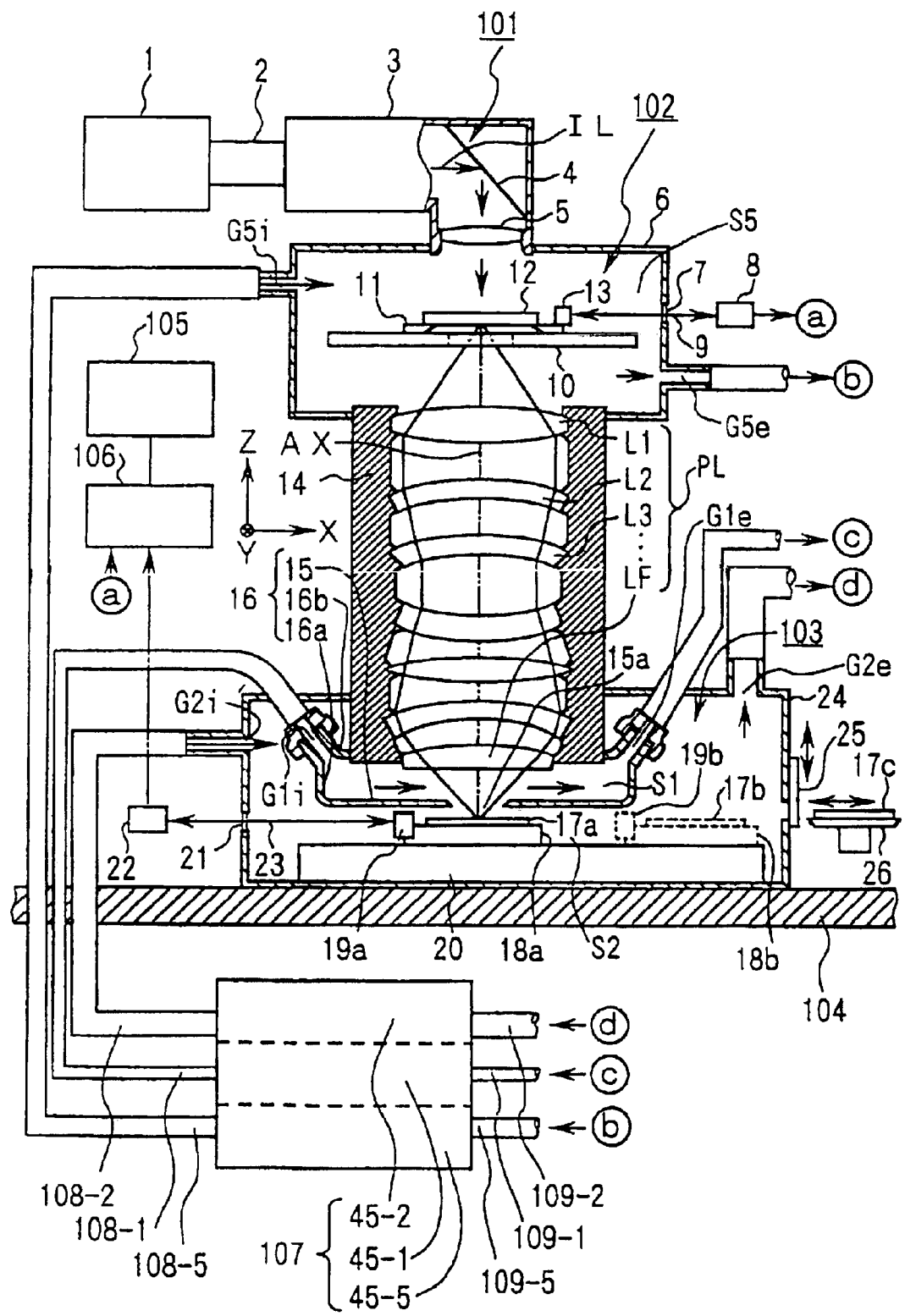
FIG. 1 is a partly broken-away schematic configuration view illustrating an exposure apparatus of a first embodiment of the present invention.
Figure 2:
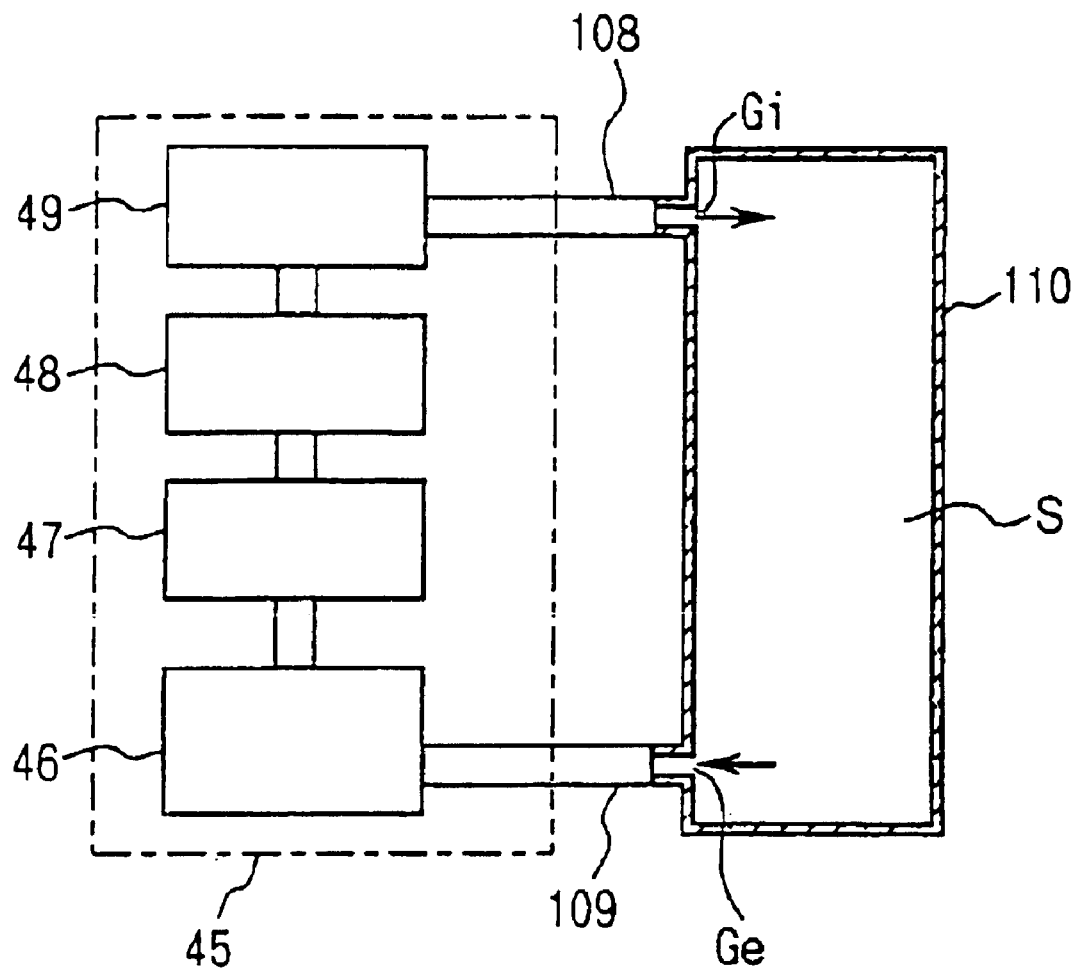
FIG. 2 is a partly broken-away schematic configuration view illustrating gas purification device 45 representing gas purification devices 45-1, 45-2, and 45-5 in FIG. 1 and corresponding space S.

Referring to FIGS. 1–3, a first embodiment according to the present invention will now be described.

FIG. 1 shows an exposure apparatus of the embodiment, and in FIG. 1, a fluorine laser ($F_2$ laser) having an oscillation wavelength of 157 nm is used as exposure light source 1. However, a light source generating light of vacuum ultraviolet region such as a krypton dimer laser ($Kr_2$ laser) of 146 nm wavelength or an argon dimer laser ($Ar_2$ laser) of 126 nm wavelength may also be used as exposure light source 1. Light source 1 emits exposure light IL constituted of laser light of 157 nm wavelength. This exposure light IL illuminates, via beam matching unit (BMU) 2 and illumination optical system 101, reticle 12 as a mask, and the image of a pattern in the illuminated area on reticle 12 is projected onto wafer 17a as a substrate to be exposed with a magnification β (β being, for example, ¼, ⅕, or ⅙) by projection optical system PL as a projection system. Wafer 17a for a semiconductor device is coated with photoresist as photosensitive material, and reticle 12 and wafer 17a respectively correspond to the first and second objects of the present invention.

In this embodiment, the main body of the exposure apparatus including the optical path from reticle 12 to wafer 17a is positioned on, for example, floor 104 of a semiconductor manufacturing factory, and exposure light source 1 is, in practice, disposed in, for example, a downstairs utility room relative to the floor 104. Hereafter, the following description will be done by setting a Z-axis parallel to optical axis AX of projection optical system PL; setting an X-axis, in a plane perpendicular to Z-axis (the plane being approximately coincident with a horizontal plane, parallel to the plane of FIG. 1; and setting a Y-axis perpendicular to the plane of FIG. 1.

Illumination optical system 101 of the embodiment is provided with an optical integrator (homogenizer), not shown, that forms a number of light source images from exposure light IL as exposure light from BMU 2, a relay lens system, not shown, an aperture diaphragm and a field stop, both not shown, mirror 4 for deflecting the optical path, condenser lens 5, etc.; and illumination optical system 101 is covered with a box-like illumination system chamber 3 with high hermeticity. The inside of illumination system chamber 3 is filled with a gas with low absorbency relative to the above-described light flux of vacuum ultraviolet region, which corresponds to the gas that transmits the exposure beam, i.e., a nitrogen gas or a rare gas (helium, neon, argon, krypton, xenon, or radon). Further, the gas in illumination system chamber 3 is separated by condenser lens 5 from a gas in reticle chamber 6 to be described later that accommodates reticle 12.

In addition, when using a fluorine laser as exposure light source 1 as in this embodiment, from among the two 157.52 nm and 157.63 nm oscillation wavelengths of the fluorine laser, an oscillation wavelength with lower absorbency relative to an impurities gas that enters the exposure optical path easily (e.g., oxygen or moisture) is selected. This advantageously affects in preventing the decrease of illuminance due to absorption by impurities gases. Further, because a nitrogen gas comes to absorb exposure light IL of about 150 nm or less wavelength, it is preferable that a rare gas is used as the gas with low absorbency relative to the exposure light (the gas that transmits the exposure beam) when the exposure wavelength is about 150 nm or less. Further, among rare gases, a helium gas is advantageous in that it has high thermal conductivity (about three times that of neon and about six times that of a nitrogen gas), has excellent thermal stability, has small refractive index fluctuation relative to variations in atmospheric pressure (about ½ times that of neon and about ⅛ times that of a nitrogen gas), and accordingly effects stable imaging characteristics. It is thus preferable that a helium gas is used in such an application in which a high premium is put on stable imaging characteristics rather than operating costs.

Next, reticle 12 is held on a reticle holder, not shown, by vacuum suction or the like; the reticle holder is fixed on reticle stage 11; and reticle stage 11 is mounted on reticle base 10 so as to be scanned in the X-direction at a predetermined velocity and be finely moved in the X-direction, the Y-direction, and the rotational direction so that synchronization errors are corrected. Reticle stage system 102 is constituted of the reticle holder, not shown, reticle stage 11, reticle base 10, etc., and space S5 enclosing reticle 12 and reticle stage system 102 is covered with the box-like reticle chamber 6 with high hermeticity. More specifically, the optical path of exposure light IL between condenser lens 5 of illumination optical system 101 and lens L1, of projection optical system PL, nearest to the reticle is enclosed by reticle chamber 6.

The inside space S5 of reticle chamber 6 is also filled with a gas, e.g., a nitrogen gas, with low absorbency relative to the above-described light flux of vacuum ultraviolet region. Specifically, the gas in reticle chamber 6 is, via exhaust port G5e and exhaust pipe 109-5, almost continuously recovered into gas purification device 45-5 (described in detail later); and a highly-purified gas that transmits the exposure beam is, via gas supply pipe 108-5 and gas supply port G5i, almost continuously supplied from gas purification device 45-5 into reticle chamber 6. Gas supply port G5i and exhaust port G5 are disposed so that they oppose to each other with reticle stage system 102 intervening between them and so that the vertical position of exhaust port G5e is lower than that of gas supply port G5i.

Further, moving mirror 13 fixed to the end portion of reticle stage 11 is, via window portion 7 of reticle chamber 6, illuminated with laser beam 9 for measurement from measurement portion 8 of a reticle interferometer. Measurement portion 8, with reference to a fixed mirror (reference mirror), not shown, fixedly positioned relative to projection optical system PL, then measures the X-coordinate, Y-coordinate, rotation angle (yawing amount), pitching amount, and rolling amount of moving mirror 13 (reticle stage 11) and supplies the measurement values to stage controller 106 and to main controller 105 that exercises the centralized control of the overall operation of the exposure apparatus. Stage controller 106 controls, via a driving portion, not shown, such as a linear motor, the operation of reticle stage 11 based on the measurement values and control information from main controller 105.

The light flux transmitted reticle 12 is condensed by projection optical system PL and forms the image of the reticle pattern onto wafer 17a. The projection optical system PL of the embodiment is constructed with lenses L1, L2, L3, . . . , LF being disposed in lens barrel 14 in this order from the reticle side; and the optical path of exposure light IL between lens L1 and lens LF is substantially hermetically sealed by lens barrel 14. Further, each of the spaces between all pairs of the neighboring lenses in lens barrel 14 is also filled with a gas, e.g., a helium gas, that transmits exposure light IL. Preferably, the gas is continuously flowing. Further, as the optical materials of lenses L1–LF, such materials as fluorite ($CaF_2$), magnesium fluoride ($MgF_2$), lithium fluoride (LiF), or quartz glass doped with a substance, e.g., fluorine or hydrogen that transmit vacuum ultraviolet light are used.

It is to be noted that because the transmittance of quartz glass doped with a predetermined substance would increasingly decreases relative to vacuum ultraviolet light of about 150 nm or less wavelength, such materials as fluorite, magnesium fluoride, and lithium fluoride are used as optical materials for refractive members when vacuum ultraviolet light of about 150 nm or less wavelength is used as the exposure beam. Because the kinds of optical materials with high transmittance relative to vacuum ultraviolet light are thus limited, such a catadioptric optical system as disclosed in Japanese Patent Application No. 10-370143 or Japanese Patent Application No. 11-666769 may be used as projection optical system PL.

Next, wafer 17a is held on a wafer holder, not shown, by vacuum suction or the like. The wafer holder is fixed on wafer stage 18a. Wafer stage 18a is mounted on wafer base 20 constituted of a level block so as to be scanned in the X-direction at a predetermined velocity and be stepwise moved in the X- and Y-directions. Wafer stage 18a is also provided with a function by which the surface of wafer 17a is made coincident with the image plane of projection optical system PL by an autofocus system based on the measurement values of an autofocus sensor, not shown. Wafer stage system 103 is constituted of the wafer holder, not shown, wafer stage 18a, wafer base 20, etc. Wafer 17a and wafer stage system 103 are covered with wafer chamber 24 with high hermeticity, and wafer chamber 24 is, via a vibration isolation bed, not shown, placed on floor 104. Further, the inside space of wafer chamber 24 is also filled with a gas, e.g., a helium gas, with low absorbency relative to the above-described light flux of vacuum ultraviolet region. Specifically, the gas in wafer chamber 24 is, via exhaust port G2e and exhaust pipe 109-2, almost continuously recovered into gas purification device 45-2 (described in detail later); and a highly-purified gas that transmits the exposure beam is, via gas supply pipe 108-2 and gas supply port G2i, almost continuously supplied from gas purification device 45-2 into wafer chamber 24. Gas supply port G2i and exhaust port G2e are disposed so as to oppose to each other with wafer stage system 103 intervening between them and with gas supply port G2i and exhaust port G2e being on the side face of wafer chamber 24 and the top side wafer chamber 24, respectively. By controlling the gas supply from gas supply port G2i and the gas exhaust through exhaust port G2e, the environment of the inside space of wafer chamber 24 is controlled.

Further, moving mirror 19a fixed to the end portion of wafer stage 18a is, via window portion 21 of wafer chamber 24, illuminated with laser beam 23 for measurement from measurement portion 22 of a wafer interferometer; and measurement portion 22, with reference to a fixed mirror, not shown, fixedly position d relative to projection optical system PL, measures the X-coordinate, Y-coordinate, rotation angle (yawing amount), pitching amount, and rolling amount of moving mirror 19a (wafer stage 18a) and supplies the measurement values to stage controller 106 and to main controller 105. Stage controller 106 controls, via a driving portion, not shown, such as a linear motor, the operation of wafer stage 18a based on the measurement values and control information from main controller 105. Meanwhile, because measurement portion 8 of the reticle side interferometer and measurement portion 22 of the wafer side interferometer include members that generate gases that absorb a light flux of vacuum ultraviolet region (electric circuit boards, electric wires, etc), it is not preferable that those portions are disposed in reticle chamber 6 and wafer chamber 24. Thus, measurement portion 8 and measurement portion 22 are, via window potion 7 and window potion 21, each constituted of a glass substrate, that transmit laser beam 9 and laser beam 23 for measurement, respectively, positioned outside of reticle chamber 6 and wafer chamber 24, respectively.

Further, open/close window 25, which is free to open/close, is disposed on the side face of wafer chamber 24, and wafer loader 26 for wafer exchange is disposed in the vicinity of open/close window 25.

When performing scanning exposure, the operations in which after stepwise moving a shot area to be exposed on wafer 17a to the scan-start-position, reticle 12 and wafer 17a are, via reticle stage 11 and wafer stage 18a, scanned in the X-direction with a velocity ratio of β, the magnification of projection optical system PL, are repeated in a step-and-scan manner; and the pattern of reticle 12 is successively transferred onto each shot area on wafer 17a.

Since such exposure requires precise alignment between reticle 12 and exposure 17a, although not specifically illustrated, the projection exposure apparatus of the embodiment is also provided with a reticle alignment microscope (RA microscope) that measures the position of an alignment mark on reticle 12 and with an alignment sensor that measures the position of an alignment mark on wafer 17a. When performing the position measurement through the RA microscope and alignment sensor, the measurement values from the above-described reticle interferometer provided with measurement portion 8 and the wafer interferometer provided with measurement portion 22 are used.

It is to be noted that when alignment between an alignment mark formed on the reticle and a reference mark provided on the wafer stage is performed via the projection optical system, the alignment is performed via an aperture of gas blowing plate 15 described later.

Meanwhile, the surface of wafer 17a to be exposed is coated with photoresist as photosensitive material. When the above-described scanning exposure is performed, the bond of molecules constituting the photoresist (mainly organic molecules) is then broken by the light energy of exposure light IL, and a part of the broken molecules is released to the upper space over wafer 17a as a so-called "outgas." With the outgas being left to stand, clouding substances generated by reaction of the outgas with vacuum ultraviolet light accumulate on the surface of lens LF, the lens nearest to wafer 17a out of the lenses of projection optical system PL, and the transmittance of projection optical system PL decreases. In other words, the illuminance (exposure intensity) on wafer 17a on exposure light IL decreases. As a result, the throughput may deteriorate because a longer exposure time is required to supply a necessary exposure dosage for the photoresist.

To address the problem, in this embodiment, between projection optical system PL and wafer 17a is provided a thin, metallic (e.g., stainless steel) plate-like gas blowing plate 15 as an aperture plate; and thus the space between projection optical system PL and wafer 17a is divided broadly into a first space S1 on the side of projection optical system PL and a second space S2 on the side of the wafer. Needless to say, however, gas blowing plate 15 has aperture portion 15a corresponding to the optical path portion of exposure light IL so as not to interrupt the imaging light flux. Further, partition wall portions 16a and 16b are provided so as to cover the side face portion between gas blowing plate 15 and projection optical system PL and the portion between the side face portion and lens barrel 14, respectively; and the first space S1 enclosed by gas blowing chamber 16 constituted of gas blowing plate 15 and partition wall portions 16a and 16b is thus hermetically sealed, except for aperture portion 15a. The second space S2 is also hermetically sealed by the outer surface of gas blowing chamber 16, the outer surface of lens barrel 14, and wafer chamber 24, except for aperture portion 15a.

Further, gas blowing chamber 16 is provided with exhaust port G1e and gas supply port G1i so that the exposure area of projection optical system PL (in the embodiment, an area elongated in the Y-direction centering on optical axis AX) intervenes between the ports, that is, so that the ports oppose to each other in the X-direction. The gas in gas blowing chamber 16 is, via exhaust port G1e and exhaust pipe 109-1, continuously recovered into gas purification device 45-1 (described in detail later); and a highly-purified gas that transmits the exposure beam is, via gas supply pipe 108-1 and gas supply port G1i, continuously supplied from gas purification device 45-1 into gas blowing chamber 16. In this gas flow operation, by way of example, the flow rate per unit area of the gas (the second gas) supplied into space S2 by gas purification device 45-2 is set smaller than that of the gas (the first gas) supplied into space S1 by gas purification device 45-1.

By thus blowing a gas in the X-direction in space S1 between gas blowing plate 15, projection optical system PL, and lens barrel 14 so that the gas crosses the upper space over the exposure area of projection optical system PL, outgases generated from the photoresist of wafer 17a are efficiently carried away downwind and are sucked into gas purification device 45-1 via exhaust port G1e. Thus, clouding substances are prevented from adhering to the surface of lens LF of projection optical system PL on the side of the wafer, and the transmittance of projection optical system PL relative to exposure light IL is maintained high. Further, because a highly-purified gas with low absorbency relative to vacuum ultraviolet light such as a nitrogen gas or a rare gas (e.g. helium or the like) is supplied from gas purification device 45-1 into space S1 via gas supply port G1i so as to compensate the sucked gas including the outgases, the transmittance on the optical path of exposure light IL between projection optical system PL and wafer 17a is also maintained high, and thus high illuminance of exposure light IL on wafer 17a can be obtained.

It is to be noted that gas blowing plate 15 does not necessarily need to be provided at the downwind side of the exposure area, but that because the outgas substances might fall onto other areas of wafer 17a and affect the areas, it is preferable that gas blowing plate 15 is provided also at the downwind side. Further, to effectively exhaust the outgas substances generated over wafer 17a, it is preferable that the distance between the surface of wafer 17a and gas blowing plate 15 is set to about 5 mm or less.

Some amount of the outgas substances, however, leaks into wafer chamber 24 through the space between wafer 17a and gas blowing plate 15. It is thus necessary that the gas in wafer chamber 24 is also circulated and purified to some extent and its contamination degree of impurities (that is set higher than that of the gas in space S1) is maintained to be below a predetermined permissible level. For this purpose, as described above, a highly-purified gas (the second gas) that transmits the exposure beam IL is supplied also to wafer chamber 24 from gas purification device 45-2.

Further, a part of the outgas substances generated from wafer 17a may not be exhausted via space S1 and may adheres, as impurities substances, to the surface of gas blowing plate 15 on the side of the wafer as impurities. It is thus preferable that gas blowing plate 15 is replaceably configured.

Further, it is preferable that as a gas to be supplied to the first space S1, helium, which has a smaller molecular weight and is lighter compared with gases such as a nitrogen gas, is used and that as a gas to be supplied to the second space S2, a nitrogen gas is used. This is because with helium being supplied to space S1, the amount of leakage into space S2 via the aperture of gas blowing plate 15 is small, and thus the outgases generated from the photoresist of wafer 17a can be effectively recovered.

Gas supply/exhaust device 107 is constituted of gas purification devices 45-1, 45-2, and 45-5 of the embodiment and of gas purification devices, not shown, for the illumination optical system and projection optical system; and gas supply/exhaust device 107 is installed, by way of example, in a downstairs utility room (a space different from the space where the main body of the exposure apparatus is positioned) relative to the floor 104. Because the configurations of gas purification devices 45-1, 45-2, and 45-5 are similar to each other, the configurations will be next described by using gas purification device 45 representing the devices.

FIG. 2 shows gas purification device 45 and space S enclosed by a corresponding chamber 110 (reticle chamber 6, gas blowing chamber 16, or wafer chamber 24 of FIG. 1); and in FIG. 2, gas purification device 45 is constituted of pump 46 for sucking and blowing, dust collecting filter 47 such as a HEPA filter (high efficiency particulate air-filter) or a ULPA filter (ultra low penetration air-filter), impurities removing filter 48 for removing oxygen, moisture, carbon dioxide, and organic gases (outgases from photoresist, etc.) in the gas to be supplied, and thermostatic device 49. Within thermostatic device 49 are also included a sensor for measuring the concentrations of impurities (oxygen, moisture, etc.) in the purified gas and a storing portion in which a highly-purified gas (nitrogen, helium, etc.) that transmits the exposure light is, being compressed or liquefied, stored.

The gas including impurities in space S in chamber 110 is, via exhaust port Ge and exhaust pipe 109, sucked by pump 46; and the sucked gas, with the impurities being removed through dust collecting filter 47 and impurities removing filter 48, enters thermostatic device 49. At thermostatic device 49, the flow rate of the gas sent from impurities removing filter 48 and its impurities concentrations are measured; and when the flow rate is within a permissible range and the impurities' concentrations is below a permissible level, thermostatic device 49 controls the temperature of the gas within a predetermined range and blows the gas, via gas supply pipe 108 and gas supply port Gi, into space S. In contrast, when the flow rate of the gas sent from impurities removing filter 48 is below the permissible range or when the impurities' concentrations is higher than the permissible level, the gas is supplemented with a highly-purified gas extracted from the above-described storing portion, and the supplemented gas, after its temperature being controlled, is blown into space S via gas supply pipe 100 and gas supply port Gi.

As a result, impurities such as oxygen moisture, and organic gases (outgases from photoresist, etc.) are removed from the gas, and at the same time, the gas that transmits the exposure light is supplied into in space S at a required flow rate. Because the gas that transmits the exposure light is recycled as much as possible in the process, even when a relatively expensive gas, such as helium, is used as the gas, the operating costs can be controlled to be low.

Furthermore, because in the embodiment, as shown is FIG. 1, the gas that transmits the exposure light (the first gas) is blown within the local space S1, and the blown gas including outgases is purified (removal of impurities) with particular emphasis by the use of gas purification device 45-1, the purity of the gas that transmits the exposure light between projection optical system PL and wafer 17a is maintained high. Accordingly, the purification (removal of impurities) of the gas blown into space S2 in wafer chamber 24 (the second gas) can be performed at a lower level compared with that of the first gas blown into space S1. In this case, the impurities removal performance of gas purification device 45-2 that blows the gas into space S2 in wafer chamber 24 can be set lower than that of gas purification device 45-1 that blows the gas into space S1. As a result, compared with a system in which a highly-purified gas is blown into the entirety of the inner space of wafer chamber 24 in a uniform manner, a smaller consumption of the gas that transmits exposure light IL is required, and thus the operating costs can be controlled to be low.

Further, because the gas is blown in the X-direction at about a constant velocity in space S1, the refractive index distribution on the optical path of the imaging light flux is uniformed, and the imaging characteristics are also maintained stabilized.

Further, gas purification device 45-5 that gas-blows into reticle chamber 6 and gas purification device 45-2 that gas-blows into space S2 in wafer chamber 24 can be made to be a common gas purification device, which can simplify the configuration of gas supply/exhaust device 107.

It is to be noted that as described above, the distance between gas blowing plate 15 and wafer 17a is preferably about 5 mm or less, but when exchanging wafer 17a on wafer stage 18a (wafer holder), a clearance is necessary for wafer 17a to move up and down. Thus, in a state in which to exchange the wafer, wafer stage 18a and wafer 17a are respectively moved to position 18b and position 17b, which are apart from the bottom of projection optical system PL, as illustrated by the dashed lines in FIG. 1, gas blowing plate 15 is preferably far apart from the wafer of position 17b. In the state, opening open/close window 25 is opened, and the wafer exchange is performed by, with the wafer of position 17b being moved up, conveying the wafer to position 17c of an arm of wafer loader 26 and then by mounting an unexposed wafer onto the wafer stage of position 18b via another arm, not shown.

It is to be noted that it is preferable that because the operations of wafer loader 26 and open/close window 25 and the up-down movement of the wafer at position 17b presumably result dust generation, the wafer exchange position is, as in the embodiment of FIG. 1, set on the downwind side of the local gas-blowing in gas blowing chamber 16 and the gas-blowing in wafer chamber 26. In other words, both of the gas-blowing of the first gas in space S1 using gas blowing plate 15 and the gas-blowing of the second gas in space S2 are preferably performed with gas-blowing from their common upwind side so that the wafer load position (wafer loader 26) is disposed on their downwind side.

Meanwhile, to set the distance between wafer 17a and gas blowing plate 15 about 5 mm or less as described above, it is not preferable that there is a step-like structure of, e.g., a few mm or higher on the wafer holder that holds wafer 17a, in other words, that there is a portion higher than the surface of wafer 17a. Thus, in the projection exposure apparatus of the embodiment, it is preferable that the upper surface of the wafer holder is made as flat as possible without forming an elevated portion higher than the surface of wafer 17a.

Further, it is also preferable that the height of the upper end of moving mirror 19a of the wafer interferometer is also made lower than that of the surface of wafer 17a. However, when the upper end of moving mirror 19a of the wafer interferometer is made lower than the surface of wafer 17a, the vertical illumination position of the laser beam for measurement deviates from the surface of wafer 17a, and if wafer stage 18a pitches or rolls, measurement errors (so-called Abbe errors) occur. To correct the measurement errors, each of the laser beams with which moving mirror 19a of the embodiment is illuminated is so configured that it is, actually, constituted of a pair of laser beams apart from each other in the Z-direction and that by determining the difference between the Z- or Y-coordinate measurement values of each pair of laser beams, the measurement errors accompanying the pitching and rolling can be corrected. With such a configuration being adopted, the distance between gas blowing plate 15 and wafer 17a can be still further smaller than the above described value of about 5 mm, and thus impurities can be more efficiently removed from the exposure optical path.

Meanwhile, an optically-performed focus detection device of oblique incident type is usually provided in a projection exposure apparatus to make the surface of a wafer to be precisely coincident with the focus plane of the projection optical system. Although not specifically illustrated, the projection exposure apparatus of the embodiment is also provided with an autofocus sensor (hereinafter, referred to as "AF sensor") as the focus detection device. In this configuration, it is required that gas blowing plate 15 does not interrupt the optical path of a light flux (detection beam) of, e.g., about from visible to near infrared range used for the focus detection by the AF sensor. For this purpose, by way of example, an aperture through which the light flux passes or a window constituted of a glass substrate that transmits the light flux may be provided at a portion of gas blowing plate 15; as another method, it may be so configured that the light flux passes through between gas blowing plate 15 and wafer 17a.

Further, as still another method, as illustrated in FIG. 3, it may be so configured that by making gas blowing plate 15 to be a pair of blowing plates separately disposed with a predetermined distance and that the light flux passes through the gapped portion between the blowing plates. The combination of the pair of blowing plates also corresponds to the aperture plate of the present invention.

Figure 3A:
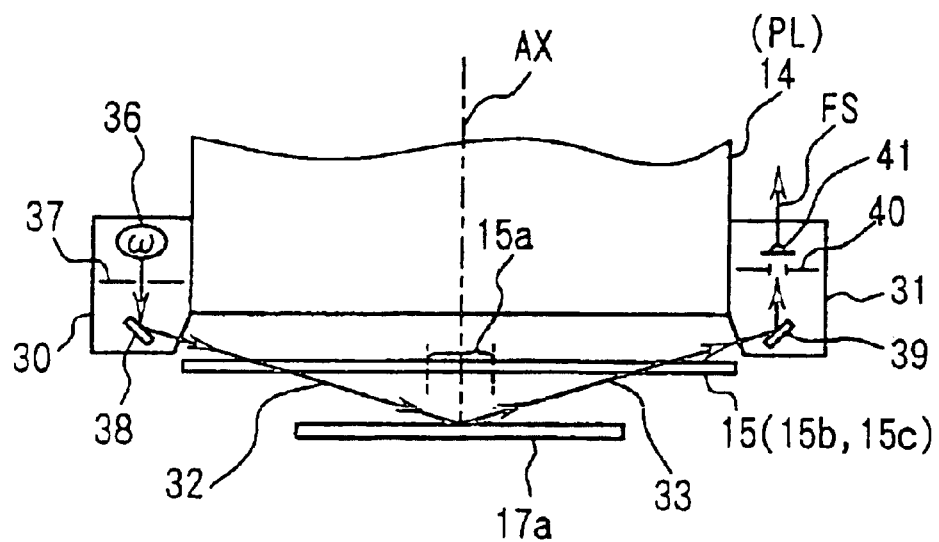
FIG. 3A is a drawing illustrating a main part of another configuration example of an autofocus sensor of the first embodiment.
Figure 3B:
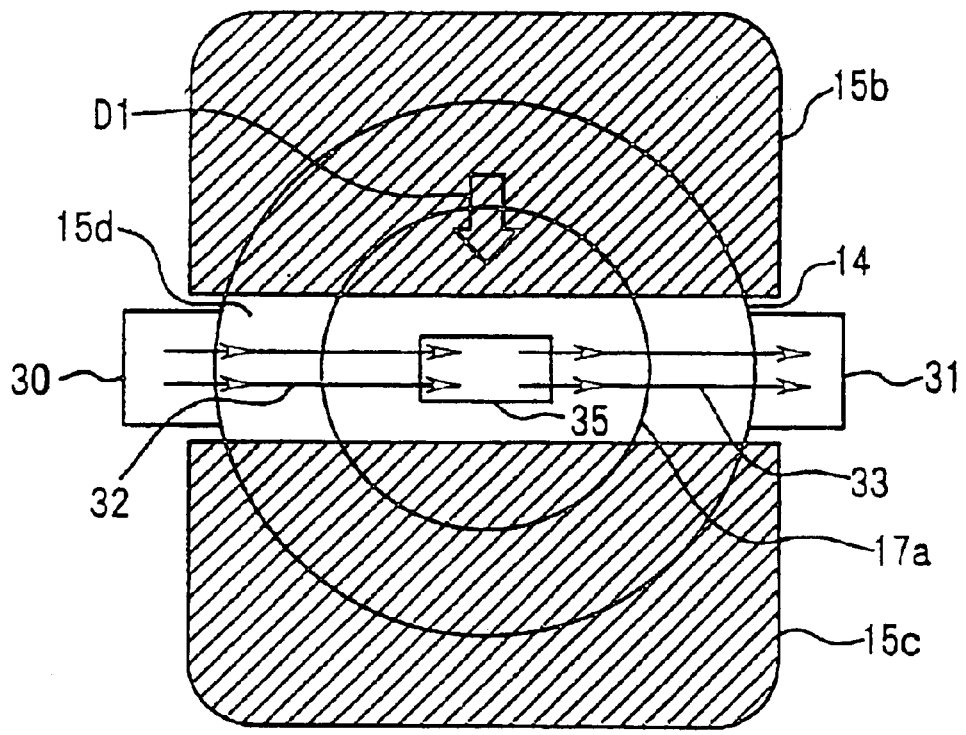
FIG. 3B is a plan view illustrating gas blowing plates 15b and 15c on the side of the bottom surface of projection optical system PL of FIG. 3A.

Specifically, FIG. 3A is a drawing illustrating an example of an AF sensor of the projection exposure apparatus of FIG. 1; FIG. 3B is a plan view illustrating members on the side of the bottom surface of projection optical system PL of FIG. 3A; and in FIG. 3A, the AF sensor is constituted of light transmission subsystem 30 and light detection subsystem 31. In light transmission subsystem 30, light transmission side slit 37 is illuminated with a light flux from light source 36 constituted of a halogen lamp (or a light emitting diode); and light flux 32 passed through light transmission side slit 37 forms, via mirror 3B and an imaging lens, not shown, a slit image on wafer 17a obliquely to the optical axis AX of the projection optical system PL.

In light detection subsystem 31, reflected light 33 from wafer 17a forms again a slit image at light detection side slit 40 via as imaging lens, not shown, and mirror 39; a part of the reflected light that passed through light detection side slit 40 is detected by photodetector 41; and detection signal FS from photodetector 41 is supplied to main controller 105 of FIG. 1. In this configuration, the positional relationship between the slit image and light detection side slit 40 is varies by the up-and-down movement of wafer 17a; and thus, by synchronously rectifying detection signal FS by, e.g., vibrating light detection side slit 40, a focus signal of which signal level varies in response to the position in optical axis AX of wafer 17a (focus position) is obtained.

During exposure, the focus position of wafer 17a can be detected through the focus signal.

In such a configuration, the average incident angle of the light flux for focus detection relative to wafer 17a is 80 degrees or more; and assuming that the numerical aperture of projection optical system PL is about 0.80, near its available maximum value, the maximum incident angle of the imaging light flux from projection optical system PL incident on wafer 17a is about 55 degrees. Because the incident angle of the light flux for focus detection is thus considerably larger than that of the imaging light flux, the light flux for focus detection is interrupted by gas blowing plate 15 if the plate is a metallic plate simply having aperture portion 15a in its center.

To address the problem, in this embodiment, gas blowing plate 15 is divided into two gas blowing plates 15b and 15c as illustrated in FIG. 3A; and it is so configured that, with light transmission subsystem 30 and light detection subsystem 31 being disposed along gap 15d, light flux for focus detection 32, reflected light 33 from the surface to be detected, and the imaging light flux from projection optical system PL pass through gap 15d. In the configuration, the longitudinal direction of exposure area 35 on wafer 17a is set along gap 15d. Further, the gas that transmits the exposure light blown between gas blowing plates 15b and 15c and projection optical system PL (lens barrel 14) is blown, with its upwind side being set on the side of gas blowing plate 15b, toward the side of gas blowing plate 15c as indicated by arrow D1. By this, the leakage amount from gap 15d between gas blowing plates 15b and 15c of the gas that transmits the exposure light (the above-described first gas) is made small; the layout of the AF sensor is facilitated; and at the same time, the operating costs can be controlled to be low.

Further, by measuring each focus position at a plurality of points on exposure area 35 by the use of a plurality of light fluxes for focus detection, the inclination between the surface of the wafer and the image plane of the projection optical system can also be measured. Further, while gas blowing plate 15c of FIG. 3B on the downwind side works effectively in preventing outgas substances from falling onto the other areas of wafer 17a as described above, the gas-blowing of the temperature-controlled first gas also works effectively in controlling the temperature of the projection optical system; and thus it is preferable that the temperature-controlled gas is flowing also around the portion of lens barrel 14 of the projection optical system on the downwind side relative to the exposure area 35 similarly to the upwind side. Thus, gas blowing plate 15c on the downwind side is important also in the viewpoint of the temperature control of the projection optical system.

Next, it is required that to increase the alignment accuracy between a reticle, of which pattern is to be transferred, and a wafer, the position measurement accuracy is the directions along the surface of the reticle and the wafer (alignment directions) is required to be increased. While, in FIG. 1, as described above, the position measurements of reticle 12 and wafer 17a in the alignment directions are performed by the laser interferometers, when the spaces (reticle chamber 6 and wafer chamber 24) of the projection exposure apparatus using the exposure light of vacuum ultraviolet range, in which reticle 12 and wafer 17a are respectively disposed, are filled with a rare gas, the rare gas, especially helium, has an advantage in that because of its small refractive index fluctuation, its wavelength fluctuation caused by variations in atmospheric pressure and temperature is small, with the result that the length measurement values of the interferometers are not easily affected.

However, in contrast with the advantage, with respect to the rare gas, especially helium, there is a problem that the refractive index difference between the rare gas and other gases included in air (nitrogen and oxygen) is large. In other words, when a nitrogen gas enters, as impurities, the optical path of an interferometer filled almost only with helium, the refractive index of the gas on the optical path of the interferometer fluctuates, with the result that errors occur in the length measurement values of the interferometer.

A method for preventing the problem is controlling the concentrations of nitrogen (or of the entirety of nitrogen, oxygen, and carbon dioxide) in the gas blown into wafer chamber 24 and reticle chamber 6 of FIG. 1 within a level of 20 ppm including its fluctuation amount. This can be realized by providing gas purification device 45 of FIG. 2 with a nitrogen gas concentration sensor and a nitrogen gas removing filter and by controlling the concentrations of the nitrogen gas in the gas blown into space S within a predetermined level. It is to be noted that because oxygen and carbon dioxide have high absorbency relative to vacuum ultraviolet light, their residual concentrations should be controlled within a level of 20 ppm also from the viewpoint of exposure light absorption, and impurities removing filter 48 in gas purification device 45 works also as an absorbing mechanism of oxygen and carbon dioxide.

Further, as another method, assuming that helium out of rare gases is supplied into reticle chamber 6 and wafer chamber 24 of FIG. 1, it may be so configured that the nitrogen gas concentrations on the optical paths of the laser beams for measurement from measurement portions 8 and 22 of the interferometers are measured, the refractive index of each optical path is estimated from the mixture ratio of nitrogen gas to helium gas, and the measurement values of the interferometers are corrected based on the estimated ratio. The adverse influence arising from the contamination with nitrogen can be prevented also by this method.

Next, referring to FIGS. 4A and 4B, a second embodiment according to, the present invention will be described. In contrast with the first embodiment of FIG. 1, in this embodiment, mechanisms for decreasing the adverse influence arising from the contamination on the optical paths of the interferometers with a gas with a different refractive index such as a nitrogen gas is provided, and in FIGS. 4A and 4B, the portions corresponding to those in FIG. 1 are donated by the same numerals or letters and the details thereof are emitted here.

Figure 4A:
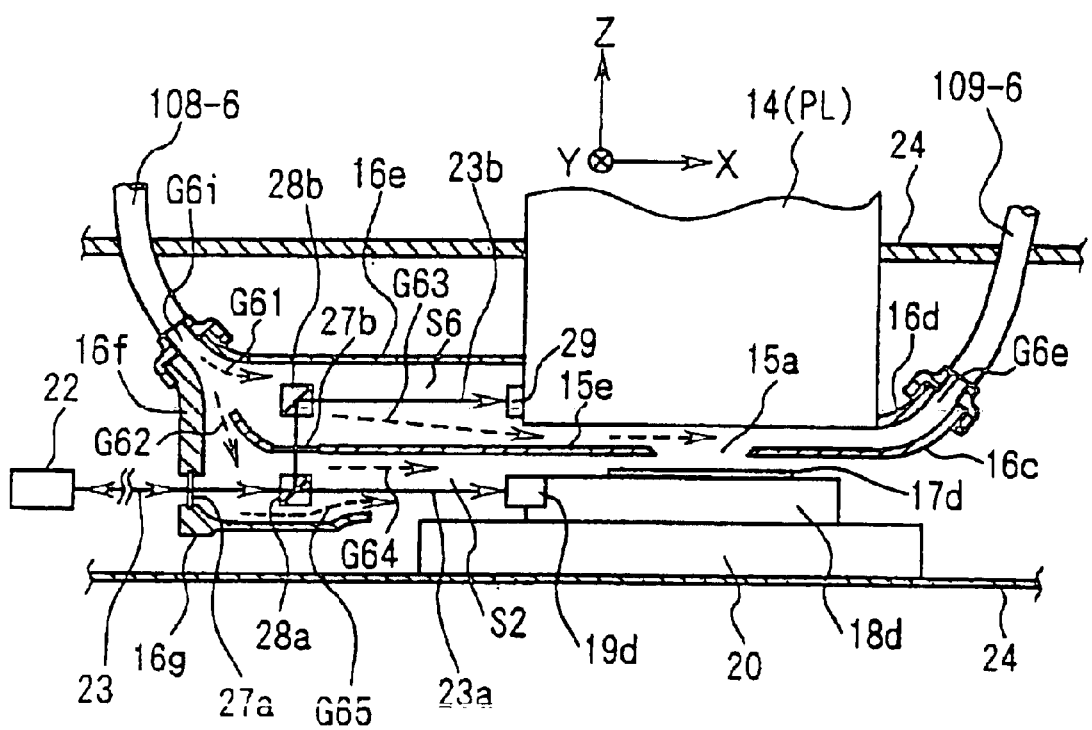
FIG. 4A is a partly broken-away schematic configuration view illustrating a wafer interferometer of a second embodiment of the present invention.
Figure 4B:
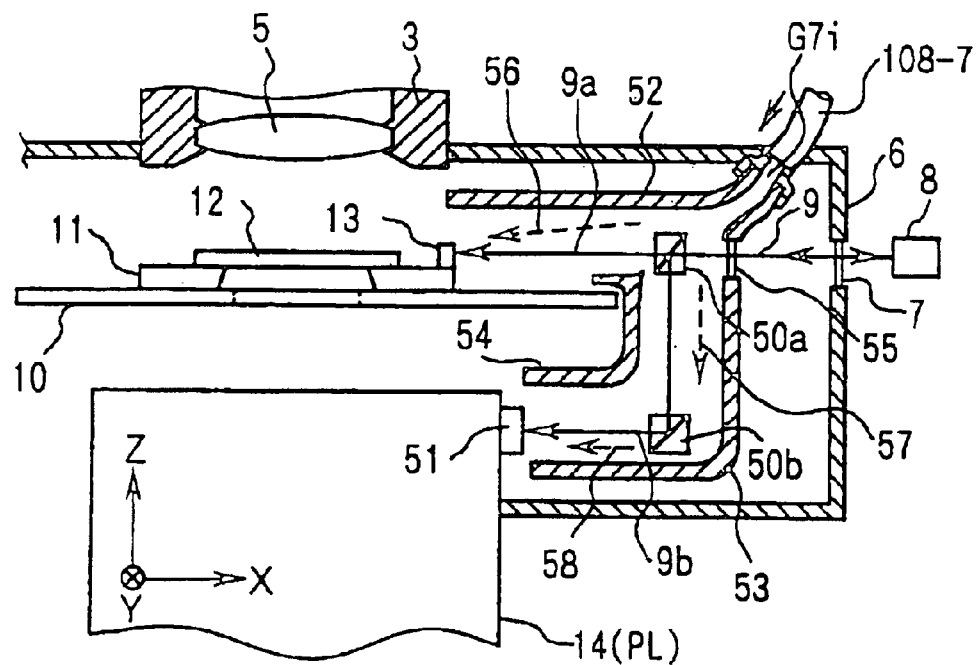
FIG. 4B is a partly broken-away schematic configuration view illustrating a reticle interferometer of the second embodiment.

FIG. 4A shows the optical path of the wafer interferometer of the embodiment; and in FIG. 4A, wafer chamber 24 accommodates wafer base 20, wafer stage 18d including a wafer holder, not shown, wafer 17a, and the bottom portion of lens barrel 14 of projection optical system PL. Also in this embodiment, is scanned in the X-direction during scanning exposure. Further, moving mirror 19d and fixed mirror 29 are fixed to the end portion of wafer stage 18d and to the bottom portion of lens barrel 14, respectively; gas blowing plate 15e having aperture potion 15a for the optical path of the imaging light flux is provided between projection optical system PL and wafer 17a and, by extension, between moving mirror 19d and fixed mirror 29; and side face partition wail 16c and upper side partition wall 16d are provided so as to cover just about the right-hand (+X-direction) half space between gas blowing plate 15e and lens barrel 14. Further, upper side partition wall 16e, side face partition wall 16f, and bottom side partition wall 16g are provided so as to cover the front side (−X-direction) space portions of moving mirror 19d and fixed mirror 29 and the left-hand end portion of gas blowing plate 15e.

In this configuration, laser beam 23 for measurement constituted of two kinds of polarized components emitted from measurement portion 22 of the wafer interferometer outside of wafer chamber 24 is, through window portion 27a of partition wall 16f, incident on polarisation beam splitter 28a; P-polarized measurement beam 23a passes through polarization beam splitter 28a and is, along the X-axis, incident on moving mirror 19d; and S-polarized reference beam 23b, after being reflected by polarisation beam splitter 28a, passes through window portion 27b provided to gas blowing plate 15e and is, along the X-axis, incident on fixed mirror 29. Measurement beam 23a reflected by moving mirror 19d and reference beam 23b reflected by fixed mirror 29 each backward goes along each incidence path and, being combined coaxially, return to measurement portion 22. Measurement portion 22 detects the returned measurement beam 23a and reference beam 23b and determines, by, e.g., a heterodyne interference method, the X-direction (scanning direction) position of moving mirror 19d (i.e., of wafer stage 20 and wafer 17d) with reference to fixed mirror 29.

In this embodiment, to make the distance between gas blowing plate 15e and wafer 17d small, the surface of a wafer holder, not shown, on wafer stage 18d and the upper surface of moving mirror 19d are set to have approximately the same height lower than that of the surface of wafer 17d. Accordingly, the height of measurement beam 23a is lower than the surface of wafer 17d; so that to correct the accompanying the pitching of wafer stage 18d, it is preferable that by making measurement beam 23a to be constituted of a pair of laser beams apart from each other in the Z-direction and determining the X-coordinates from both of the beams, the average X-coordinate of the X-coordinates for example, is corrected with the pitching amount determined from the difference between the X-coordinates.

As described above, measurement portion 22 is a measurement portion for the X-axis, but similarly, a measurement portion for the Y-axis, not shown, is also provided. Also is this embodiment, as described above, the space between projection optical system PL and wafer 17d is divided by gas blowing plate 15s broadly into a first space 66 on the side of projection optical system PL and a second space on the side of the wafer. Further, the optical paths of measurement beam 23a and reference beam 23b are nearly-fully enclosed by partition walls 16e, 16f, and 16g and by gas blowing plate 15e.

Further, exhaust port G6e is provided at the upper end on the −X-direction side of the first space S6; gas supply port G6i is provided at the upper end on the −X-direction side; exhaust port G6e and gas supply port G6i are each connected to gas purification device 45-1 of FIG. 1 via exhaust pipe 109-6 and gas supply pipe 108-6, respectively; and the gas in space S6, after the gas being sucked into gas purification device 45-1 and its impurities being removed thereby, is blown into space S6 with a highly-purified gas that transmits the exposure beam (nitrogen or a rare gas such as helium) being added as necessary. The gas-blowing direction of the embodiment is parallel to the X-direction along the optical paths of measurement beam 23a and reference beam 23b i.e., parallel to the scanning direction of the wafer during scanning exposure.

In this embodiment, gas G61, a part of the gas supplied via gas supply port G6i, flows along the optical path of reference beam 23b in space S6; and, further, gas G63, a part of gas G61, flows, within the space between gas blowing plate 15e and projection optical system PL, to the side of exhaust port G6e. By this, similarly to the embodiment of FIG. 1, outgas substances from wafer 17d are efficiently exhausted. Further, gas G62, the rest of the supplied gas, after flowing between gas blowing plate 15a and partition wall 16f, flows along the optical path of measurement beam 23a, as the upper and lower gases G64 and G65 relative to the optical path, to the side of wafer stage 18d.

In this process, the blown gases G61, G63, G64, and G65 have the same origin, i.e., the gas (the first gas) blown from gas supply port G6i; and thus, both of the gases blown along the optical paths of measurement beam 23a and reference beam 23b include impurities (nitrogen gas, etc.) of the same concentrations (contamination degree) and have the same refractive index. Therefore, as long as the position of wafer 17d (moving mirror 19d) is determined by the difference of the two optical path lengths as in this embodiment, the fluctuation on the optical paths of the interferometer of, e.g., the nitrogen gas concentrations hardly affect the position measurement values. Furthermore, when the optical path length from polarization beam splitter 28a to moving mirror 19d is equal to the optical path length from polarisation beam splitter 28a, via mirror 28b, to fixed mirror 29, i.e., when a so-called dead path is zero, the fluctuation on the optical paths of the interferometer of, e.g., the nitrogen gas concentrations never affect the position measurement values.

However, because the above-described zero dead path condition does not hold when wafer stage 18d (moving mirror 19d) moves deviating from the condition, it is preferable that, also in the embodiment of FIG. 4A, the impurities concentrations of the gas supplied from gas supply port G6i is controlled within a predetermined permissible level. For example, the concentrations fluctuation amount of nitrogen gas as the impurities is preferably controlled within a level of 100 ppm. Alternatively, also in this case, as described above, by measuring the nitrogen gas concentrations, the refractive index variation amount on the optical paths of the interferometer can be corrected.

Similarly, FIG. 45 shows the optical path of the reticle interferometer of the embodiment; and in FIG. 45, reticle chamber 6 accommodates reticle base 10, reticle stage 11, reticle 12, and the upper end portion of lens barrel 14 of projection optical system PL. Further, moving mirror 13 and fixed mirror 51 are fixed to the end portion of reticle stage 11 and to the upper end portion of lens barrel 14, respectively; and upper side partition wall 52, outer side partition wall 53, and inner side partition wall 54 are provided so as to cover, in an oxbow-like manner, the front side (+X-direction) space portions of awing mirror 13 and fixed mirror 51.

In this configuration, laser beam 9 for measurement emitted from measurement portion 8 for the X-axis of the reticle interferometer outside of reticle chamber 6 is, through window portion 55a of partition wall 53, incident on polarization beam splitter 50a; P-polarized measurement beam 9a simply passes through polarization beam splitter and is, along the X-axis, incident on moving mirror 13; and S-polarized reference beam 9b, after being reflected by polarization beam splitter 50a and being reflected by prism type mirror 50b, is, along the X-axis, incident on fixed mirror 51. Measurement beam 9a reflected by moving mirror 13 and reference beam 9b reflected by fixed mirror 51 each backward goes along each incidence path and, being combined coaxially, return to measurement portion 8. Measurement portion 8, similarly to the wafer interferometer, determines the X-direction (scanning direction) position of moving mirror 13 (i.e., of reticle stage 11 and reticle 12) with reference to fixed mirror 51. In this manner, the optical paths of measurement beam 9a and reference beam 9b are nearly-fully enclosed by partition walls 52, 53, and 54.

Further, gas supply port G7i is provided at the boundary portion of partition walls 52 and 53; although not specifically illustrated, an exhaust port is provided at the −X-direction side of reticle base 10; the exhaust port and gas supply port G7i are each connected to gas purification device 45-5 of FIG. 1 via an exhaust pipe and gas supply pipe 108-7, respectively; and the gas in reticle chamber 6, after the gas being sucked into gas purification device 45-5 and its impurities being removed thereby, is resupplied from gas supply port G7i with a highly-purified gas that transmits the exposure beam (nitrogen or a rare gas such as helium) being added as necessary. The gas-blowing direction of this embodiment is parallel to the X-direction along the optical paths of measurement beam 9a and reference beam 9b, i.e., parallel to the scanning direction of the reticle during scanning exposure. It is to be noted that although not specifically illustrated, a Y-axis reticle interferometer is also similarly provided.

Is this embodiment, gas 56, a part of the gas supplied via gas supply port G7i, flows along the optical path of measurement beam 9a; the gas 57, the rest of the supplied gas, after downward flowing between partition walls 52 and 53, flows, as gas 58 along the optical path of reference beam 9b, to the side of projection optical system PL. In this process, the blown gases 56 and 58 include impurities (nitrogen gas, etc.) of the same concentrations (contamination degree) and thus have the same refractive index. Therefore, as long as the position of reticle 12 is determined by the difference of the two optical path lengths as in this embodiment, the fluctuation on the optical paths of the interferometer of, e.g., the nitrogen gas concentrations hardly affect the position measurement values.

In the meantime, in such a scanning exposure apparatus as shown in FIG. 1, it is required that exposure should be performed by scanning both of reticle 12 and wafer 17a with the imaging relationship between them being kept. Further, to realize high-precision scanning, an air bearing is implemented in each of wafer stage 18a and reticle stage 11. In an air bearing system, a gas with predetermined pressure is supplied to an air pad provided with a blowhole at its interface surface with a base; the air pad is floated by the gas being blown from the blowhole against the base; and the friction between the air pad and the base is reduced. In this system, the air pad is fixed to the bottom surface of the movable portion of the stage (reticle 12 and wafer 17a). It is to be noted that because the air bearing itself does not have an acceleration function, the acceleration/deceleration operations are performed by, e.g., a linear motor.

Wafer stage 18a and reticle stage 11 of the exposure apparatus considerably weigh, and to float those stages, a considerable flow rate of gas is required. Further, if conventional air bearing system is adopted, the gas for floating is blown from the air pad and then diffuses into wafer chamber 24 and reticle chamber 6. The gas supplied to the air pad must be a gas with low absorbency relative to exposure light (in this embodiment, vacuum ultraviolet light), but if a large amount of gas from which oxygen, moisture, etc. are sufficiently removed is supposed to be supplied so as to float wafer stage 18a and reticle stage 11, the configuration of supply/exhaust device 107 would be large-sized and complicated; and thus the manufacturing costs of device would increase and the operating costs would also considerably increase.

To address this problem, in the above-described embodiment of FIG. 1, an air bearing system utilizing a differential exhaust type air pad is adopted.

Figure 5:
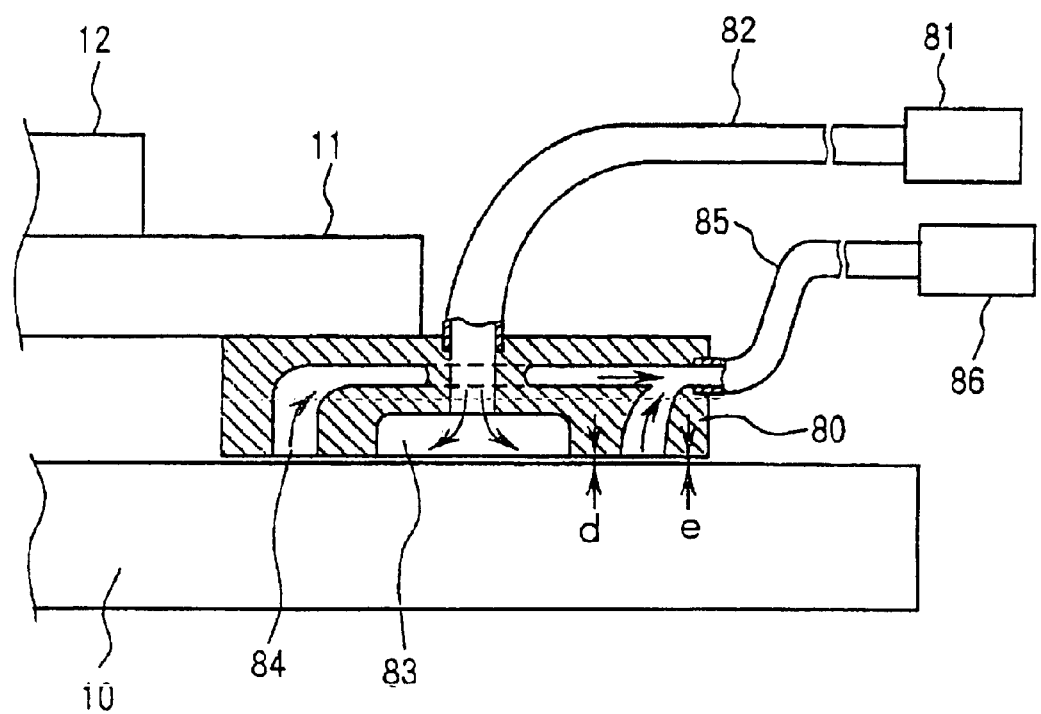
FIG. 5 is an enlarged, partly broken-away drawing illustrating a main part of a differential exhaust type air bearing mechanism of a reticle stage of the first embodiment.

FIG. 5 is an enlarged, broken-away drawing illustrating the differential exhaust type air pad 80 portion (air bearing device) of for reticle stage 11 in FIG. 11; and in FIG. 5, the gas for floating (corresponding to the fourth gas of the present invention) that is supplied from gas source 81 via gas supply pipe 82 is blown from blowhole 83 in air pad 80 against reticle bass 10. At the same time, by connecting gas sucking groove 84 surrounding blowhole 83 of air pad 80 to sucking pump 86 via exhaust pipe 85, the inside of exhaust pipe 85 is depressurized; and the gas blown from blowhole 83 is, being sucked from the surrounding gas sucking groove 84, exhausted via exhaust pipe 85.

By this, air pad 80 can be floated over reticle base 10 so that distances d and e are about a few μm, and also the gas for floating can be almost completely prevented from leaking to the outside of air pad 80.

As described above; because the gas used in the air bearing of the embodiment hardly leaks into the exposure light path space, the permissible impurities concentrations (contamination degree) level of the gas (e.g., a nitrogen gas of relatively low impurity) used in the air bearing can be greatly relaxed in this embodiment, which advantageously effects in view of costs. Alternatively, dry air for example, can be utilised as the gas for floating, which can still further lower costs.

Additionally, to further decrease the leakage amount of the gas from the air bearing, coating or polishing treatment of the surface of reticle base 11 would effectively works. Note that in this embodiment, a differential exhaust type air bearing is adopted also in wafer stage 18a.

It is to be noted that although the present invention is applied to a scanning exposure type projection exposure apparatus in the above embodiments, the present invention can be applied also to an exposure apparatus such as a one-shot exposure type exposure apparatus (stepper, etc.). Further, the second embodiment of the present invention can be applied also to an exposure apparatus such as a proximity type exposure apparatus.

Further, although, in the above, the exposure light beam of the present invention is a light beam from an excimer laser and the like, a harmonic wave obtained by amplifying single-wavelength laser light of infrared or visible range oscillated from a DFB (distributed feedback) semiconductor laser or from a fiber laser by, e.g., a fiber amplifier doped with erbium (Er) (or co-doped with erbium and ytterbium (Yb)) and by then wavelength-converting the amplified light by the use of a nonlinear optical crystal may also be utilised as the exposure light.

For example, assuming that the oscillation wavelength range of the single-wavelength laser is from 1.544 to 1.553 μm, an 8th harmonic wave having a wavelength within from 193 to 194 nm range, i.e., an ultraviolet beam having approximately the same wavelength as that of an ArF laser, can be obtained; and assuming that the oscillation wavelength range is from 1.57 to 1.58 μm, a 10th harmonic wave having a wavelength within from 157 to 158 nm range, i.e., an ultraviolet beam having approximately the same wavelength as that of an $F_2$ laser, can be obtained.

Further, assuming that the oscillation wavelength range is from 1.03 to 1.12 μm, a 7th harmonic wave having a generated wavelength within from 147 to 160 nm range is outputted; and, in particular, assuming that the oscillation wavelength range is from 1.09 to 1.106 μm, a 7th harmonic wave having a generated wavelength within from 157 to 158 nm range, i.e., an ultraviolet beam having approximately the same wavelength as that of an $F_3$ laser, can be obtained. As the single-wavelength oscillating laser of this case, an ytterbium-doped fiber laser, for example can be used.

Further, in the manufacturing process of the exposure apparatus, the illumination optical system and the projection optical system, each constituted of a plurality of optical elements, are incorporated in the exposure apparatus main body and subjected to optical adjustments, and then the wafer stage (in the case of the scanning type exposure apparatus, also the reticle stage) is installed in the exposure apparatus main body and is equipped with wiring and piping. Further, the gas blowing plate is provided between projection optical system PL and the wafer; the partition walls, etc. constituting reticle chamber 6 and wafer chamber 24 are assembled, the gas supply pipes for supplying the gases that transmit the exposure light into reticle chamber 6 and wafer chamber 24 and into the space between projection optical system PL and gas blowing plate 15 are connected; and exhaust pipes for exhausting the gases in those spaces are connected. The exposure apparatus of each of the above embodiments can be manufactured by further performing overall adjustment (electrical adjustment, operation confirmation, etc.). In addition, the exposure apparatus should preferably be manufactured in a clean room where its temperature, cleanliness level, etc. are controlled.

Device Manufacturing Method

Next, as embodiment of a device manufacturing method in which the above-described exposure apparatus is used in a lithography process.

Figure 6:
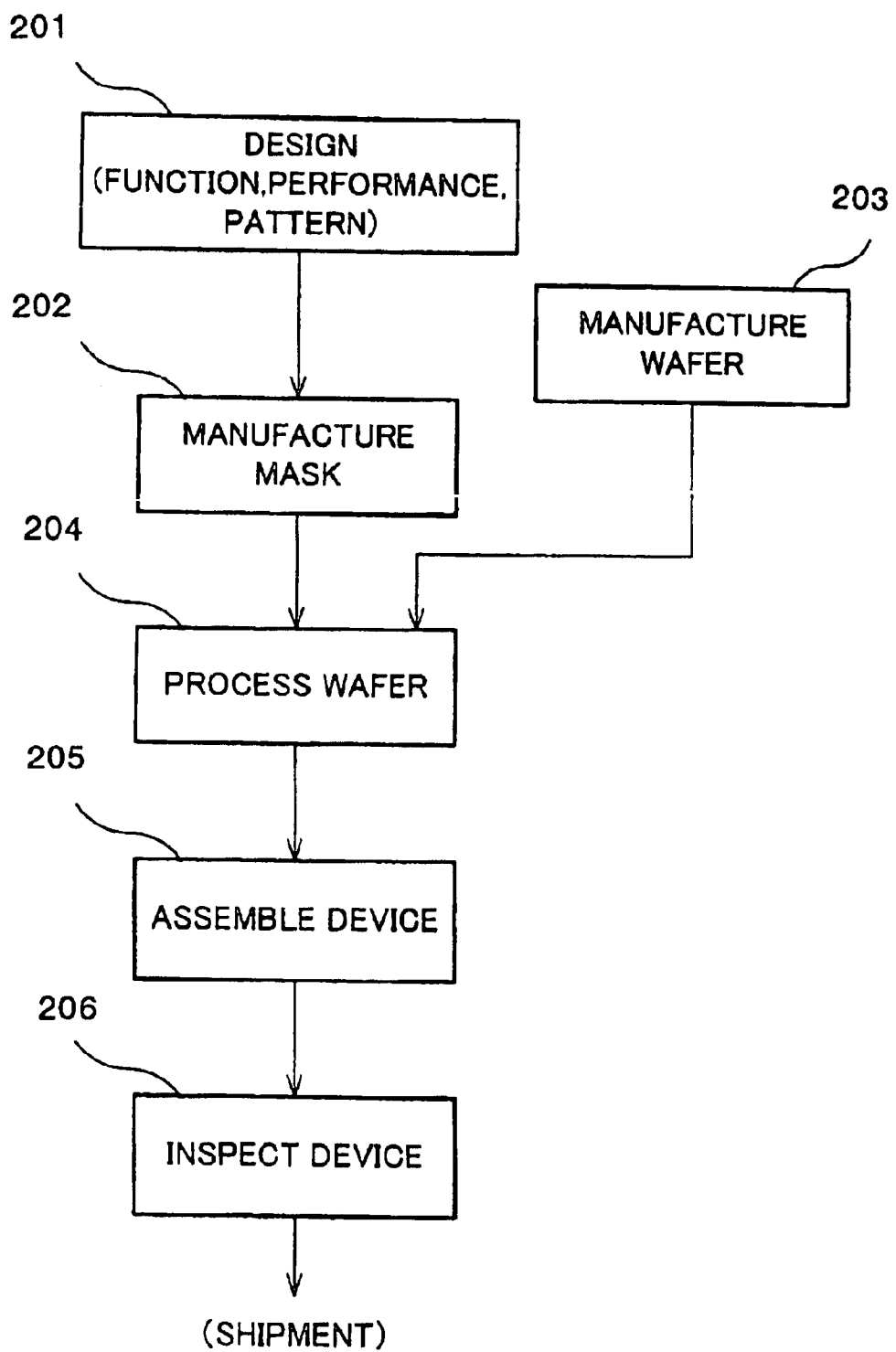
FIG. 6 is a flowchart for illustrating an embodiment of a device manufacturing method according to the present invention.

In FIG. 6, a flowchart of a manufacturing example of a device (a semiconductor chip of IC, LSI, or the like, a liquid crystal panel, a CCD, a thin film magnetic head, or a micromachine) is shown. As shown in FIG. 6, first, at step 201 (design step), the function/performance design of a device (e.g., the circuit design of a semiconductor device) is performed, and the pattern design for realizing the function is performed. Subsequently, at step 202 (mask manufacturing step), a mask on which the designed circuit pattern is formed is manufactured. On the other hand, at step 203 (wafer manufacturing step), a wafer is manufactured using a material such as silicon.

Next, at step 204 (wafer processing step), by using the mask and the wafer prepared at steps 201–203, the actual circuit or the like is formed on the wafer by a lithography technology as described below. Next, at step 205 (device assembling step), a device is assembled by using the wafer processed at step 204. In step 205, a dicing process, a bonding process, a packaging process (chip encapsulation), etc. are included as necessary.

Lastly, at step 206 (test step), tests such as an operation check test, an endurance test, etc. of the device manufactured at step 250. After through such processes, the device is finally completed and shipped.

Figure 7:
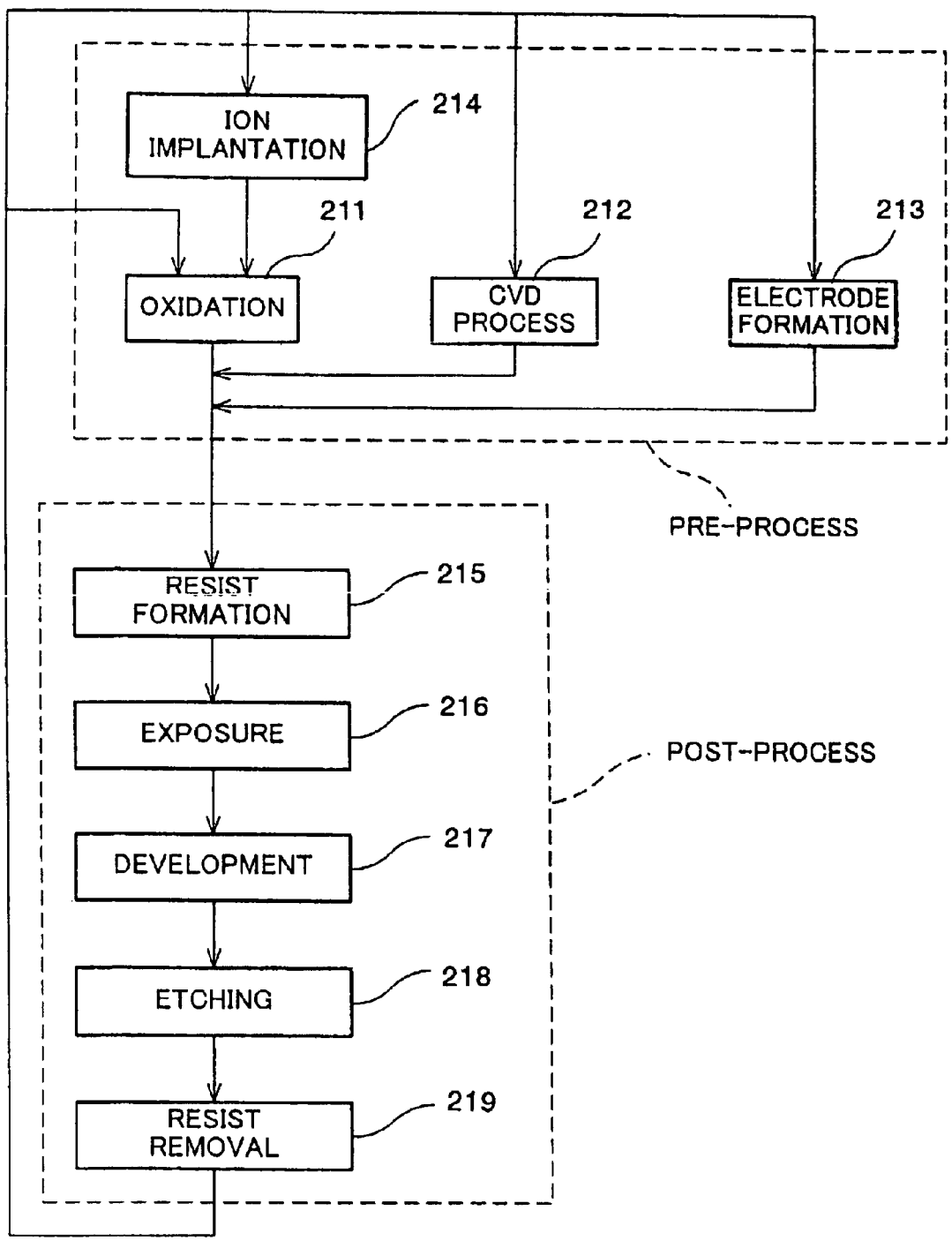
FIG. 7 is a flowchart illustrating processes in step 204 of FIG. 6.

FIG. 7 illustrates a detailed flowchart example of the above-described step 204 in the case of the semiconductor device. At step 211 (oxidization step) of FIG. 7, the surface of the wafer is oxidized. At step 212 (CVD step), an insulating layer is formed on surface of the wafer. At step 213 (electrode forming step), electrodes are formed on the wafer by deposition. At step 214 (ion implantation step), ions are implanted into the wafer. Each of the above steps 211–214 constitutes a pretreatment process of each wafer process stage; and each step is selectively performed as required by each wafer process stage.

At each wafer process stage, after the above-described pretreatment process being completed, an after-treatment process is performed as described below. In the after-treatment process, first, at stop 215 (resist forming step), the wafer is coated with photosensitive material. Subsequently, at stop 216 (exposure step), the circuit pattern on the mask is transferred onto the wafer by using the exposure apparatus and exposure method of each of the above-described embodiments. Next, at step 218 (etching step), the bare portions, on which the resist does not remain, are removed by etching. Finally, at step 219 (resist removing step), the resist, which is now redundant after the etching step, is removed.

By repeating the pretreatment and the after-treatment, a multi-layered circuit pattern is formed on the wafer.

Because when the above-described device manufacturing method of the embodiment is used, the exposure apparatus of the above-described embodiments is used, the productivity of highly-integrated devices can be improved by virtue of the improvement of exposure accuracy and throughput.

It is to be noted that needless to say, the present invention is not limited to the above-described embodiments, and various configurations can be made within the spirit and scope of the invention.

What is claimed is:

1. An exposure method in which a second object is exposed, via a projection system, with an exposure beam that has passed a pattern of a first object, said exposure method comprising:

disposing a stage holding said first object or said second object and moving on a base member in a space supplied with a first gas that transmits said exposure beam;

floating said stage on said base member in a differential exhaust system by blowing a second gas and sucking said second gas; and setting the permissible absorbency limits of said second gas relative to said exposure beam higher than that of said first gas.

2. An exposure method according to claim 1, wherein said first gas and said second gas are different gases from each other.

3. An exposure apparatus to which a second object is exposed, via a projection system, with an exposure beam that has passed a pattern of a first object, said exposure apparatus comprising:

a stage that holds said first object or said second object and moves on a base member;

a chamber that substantially hermetically seals a space enclosing said stage;

a gas supply device that supplies a first gas that transmits said exposure beam into said chamber;

an air bearing device that floats said stage on said base member in a differential exhaust system by blowing a second gas and sucking said second gas; and a setting device that sets the permissible absorbency limits of said second gas relative to said exposure beam higher than that of said first gas.

4. An exposure method for exposing a second object, via a projection system, with an exposure beam that has passed through a pattern of a first object, comprising:

enclosing a first space, of spaces between the projection system and the second object, on the projection system side by an enclosure member in which a first aperture is formed in a region in which the exposure beam is transmitted, substantially sealing the first space, excluding said first aperture of the enclosure member, supplying a gas that transmits the exposure beam into the first space from a supply port, which is different from the first aperture, provided in the enclosure member, and exhausting the gas in the first space exhaust port, which is different from the first aperture.

5. The exposure method as set forth in claim 4, wherein in the first space, the gas is supplied from the supply port arranged on one side of the exposure beam, and in the first space, the gas is exhausted from the exhaust port arranged on the other/side of the exposure beam.

6. The exposure method as set forth in claim 5, wherein the exhaust port is arranged facing the supply port.

7. The exposure method as set forth in claim 6, wherein in the first space, the gas flows in one direction.

8. The exposure method asset forth in claim 4, wherein the exposure beam is vacuum ultraviolet light with 180 nm wavelength or less, and the gas that transmits the exposure beam is a rare gas or nitrogen gas.

9. The exposure method as set forth in claim 4, wherein a measuring beam and a reference beam are irradiated onto a stage and a predetermined reference member, respectively, that move along with the first object or the second object, and a position of the first object or the second object with respect to the reference member is measured; and the optical paths of the measuring beam and the reference beam are made to have a gas atmosphere with approximately the same contamination degree of impurities that absorb the exposure beam.

10. The exposure method as set forth in claim 4, wherein a substance from the second object generated by irradiating the exposure beam is exhausted along with the gas flowing through the first space.

11. The exposure method as set forth in claim 4, wherein the enclosure member has an aperture in a region in which a detecting beam for detecting a position of the second object is transmitted.

12. A method of manufacturing a device, including a process in which a device pattern is transferred onto a workpiece, wherein the device pattern is transferred onto the workpiece, using the exposure method as set forth in claim 4.

13. An exposure method for exposing a second object, via a projection system, with an exposure beam that has passed through a pattern of a first object, comprising:

enclosing a first space, of spaces between the projection system and the second object, on the projection system side by an enclosure member in which a first aperture is formed in a region in which the exposure beam is transmitted, supplying a first gas that transmits the exposure beam into the enclosure member from a gas supply port provided in the enclosure member, exhausting a substance generated from the second object enclosed in the enclosure member, along with the first gas, from a second aperture different from the first aperture, and exhausting a substance generated from the second object and existing in a second space from the second space.

14. The exposure method as set forth in claim 13, wherein the gas supply port and the second aperture different from the first aperture are arranged facing each other.

15. The exposure method as set forth in claim 14, wherein in the first space, the first gas flows in one direction.

16. The exposure method as set forth in claim 13, wherein the second space is formed by arranging the enclosure member so as not to contact the second object.

17. The exposure method as set forth in claim 16, wherein an interval between the enclosure member and the second object is 5 mm or less.

18. The exposure method as set forth in claim 13, wherein a second gas transmitting the exposure beam is supplied to a chamber containing the second object and a stage holding the second object, and the second gas flows into the second space.

19. The exposure method as set forth in claim 18, wherein the chamber has an exhaust port that exhausts a substance generated from the second object and existing in the second space.

20. The exposure method as set forth in claim 18, wherein a contamination degree of impurities that absorb the exposure beam of the first gas in the first space is lower than that of the second gas in the second space.

21. An exposure apparatus that exposes a second object, via a projection system, with an exposure beam that has passed through a pattern of a first object, comprising:
   an enclosure member arranged between the projection system and the second object and surrounding a first space, of spaces between the projection system and the second object, on the projection system side, and substantially sealing the first space, excluding a first aperture of the enclosure member through which the ensure beam is transmitted;
   a first gas supply mechanism arranged in the first space and supplying a first gas, which transmits the exposure beam, into the first space through a supply port different from the first aperture; and
   a first exhaust mechanism arranged in the enclosure member and exhausting the gas in the first space through an exhaust port different from the first aperture.

22. The exposure apparatus as set forth in claim 21, wherein the supply port and the exhaust port are arranged on the opposite side of an optical path of the exposure beam.

23. The exposure apparatus as set forth in claim 22, wherein the enclosure member is arranged so as not to contact the second object.

24. The exposure apparatus as set forth in claim 23, wherein the enclosure member is supported by the projection system.

25. The exposure apparatus as set forth in claim 23, wherein an interval between the enclosure member and the second object is 5 mm or less.

26. The exposure apparatus as set forth in claim 22, wherein the enclosure member is provided with an aperture plate in which the first aperture through which the exposure light is transmitted is formed and a partition wall member arranged between the aperture plate and the projection system, and the supply port and the exhaust port are arranged in the partition wall member.

27. The exposure apparatus as set forth in claim 21, further comprising:
   a chamber which substantially seals a second space, of the spaces between the projection system and the second object, on the second object side, excluding the aperture of the enclosure member, and
   a second gas supply mechanism connected to the chamber and supplying the second gas, which transmits through the exposure beam, into the chamber.

28. The exposure apparatus as set forth in claim 27, further comprising:
   a stage contained within the chamber and holding the second object;
   a reference member arranged in the projection system and being stationary with respect to the projection system; and
   an interferometer that irradiates a measuring beam and a reference beam onto the stage and the reference member, respectively, and measures a position of the first objector the second object with respect to the reference member.

29. The exposure apparatus as set forth in claim 28, wherein a contamination degree of impurities that absorb the exposure beam is approximately the same in an optical path of the measuring beam and an optical path of the reference beam.

30. The exposure apparatus as set forth in claim 21, further comprising:
   a second exhaust mechanism arranged at a position different from a position of the first exhaust mechanism, and exhausting a substance generated from the second object and existing in a second space, of the spaces between the projection system and the second object on the second object side.

31. The exposure apparatus as set forth in claim 30, further comprising:
   a chamber arranged around a stage that holds the second object, and containing the stage, and
   a second gas supply mechanism connected to the chamber and supplying a second gas, which transmits the exposure beam, into the chamber.
   wherein the second exhaust mechanism is arranged in the chamber.

32. The exposure apparatus as set froth in claim 23, further comprising a position detecting mechanism which irradiates a beam to the second object through the first aperture, and detects the beam reflected by the second object through the first aperture.

33. The exposure apparatus as set forth in claim 23, further comprising a position detecting mechanism which irradiates a beam to the second object and detects the beam reflected by the second object, and the enclosure member has an aperture in a region in which the detecting beam is transmitted.

34. The exposure apparatus as set forth in claim 23, wherein at least a part of the enclosure member is arranged between the second object and a lens which is the nearest lens of the projection system.

35. The exposure apparatus as set forth in claim 26, wherein at least a part of the aperture plate is arranged between the second object and a lens which is the nearest lens of the projection system.

36. An exposure apparatus that exposes a second object, via a projection system, with an exposure beam that has passed through a pattern of a first object, comprising:
   a first enclosure member arranged between the projection system and the second object, and surrounding a first space, of spaces between the projection system and the second object, on the projection system side, and having a first aperture of the enclosure member through which the exposure beam is transmitted;

a first gas supply mechanism arranged in the first enclosure member and supplying a first gas, which transmits the exposure beam, into the first space through a supply port different from the first aperture;

a first exhaust mechanism arranged in the first enclosure member and exhausting the gas in the first space through an exhaust port different from the first aperture;

a stage holding the second object;

a second enclosure member which encloses the stage, the second object, the first enclosure member and a part of projection system;

a second gas supply mechanism supplying a second gas, which transmits the exposure beam, into the space surrounded by the second enclosure member; and a second gas exhaust mechanism exhausting a gas in the space surrounded by the second enclosure member.

37. An exposure apparatus as set forth in claim 36, wherein a contamination degree of impurities that absorb the exposure beam of the first gas in the first space is lower than that of the second gas in the space surrounded by the second enclosure member.

* * * * *